United States Patent
Ando et al.

(10) Patent No.: US 10,720,502 B2
(45) Date of Patent: Jul. 21, 2020

(54) VERTICAL TRANSISTORS HAVING A LAYER OF CHARGE CARRIERS IN THE EXTENSION REGION FOR REDUCED EXTENSION REGION RESISTANCE

(71) Applicant: International Business Machines Corporation, Armonk, NY (US)

(72) Inventors: Takashi Ando, Tuckahoe, NY (US); Pouya Hashemi, White Plains, NY (US); Choonghyun Lee, Rensselaer, NY (US); Alexander Reznicek, Troy, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/166,384

(22) Filed: Oct. 22, 2018

(65) Prior Publication Data

US 2020/0127104 A1    Apr. 23, 2020

(51) Int. Cl.
*H01L 29/417* (2006.01)
*H01L 29/423* (2006.01)
*H01L 29/78* (2006.01)
*H01L 29/66* (2006.01)

(52) U.S. Cl.
CPC .. *H01L 29/41791* (2013.01); *H01L 29/42356* (2013.01); *H01L 29/66666* (2013.01); *H01L 29/66803* (2013.01); *H01L 29/785* (2013.01); *H01L 29/7827* (2013.01)

(58) Field of Classification Search
CPC ......... H01L 29/41791; H01L 29/42356; H01L 29/66666; H01L 29/66803; H01L 29/7827; H01L 29/785
See application file for complete search history.

(56) References Cited

U.S. PATENT DOCUMENTS

| | | | |
|---|---|---|---|
| 6,891,234 B1 | 5/2005 | Connelly et al. | |
| 7,087,471 B2 | 8/2006 | Beintner | |
| 9,312,183 B1 * | 4/2016 | Kim | H01L 21/82343 |
| 9,634,142 B1 * | 4/2017 | Schepis | H01L 29/66803 |
| 9,640,667 B1 * | 5/2017 | Balakrishnan | H01L 29/42392 |
| 9,660,057 B2 | 5/2017 | Liu et al. | |
| 10,461,186 B1 * | 10/2019 | Zhang | H01L 29/7827 |

(Continued)

OTHER PUBLICATIONS

Kita et al., "Intrinsic Origin of Electric Dipoles Formed at High-k/SiO 2 Interface," IEDM 2008 Electron Devices Meeting, IEEE, 2008, 4 pages.

*Primary Examiner* — Allan R Wilson
(74) *Attorney, Agent, or Firm* — Cantor Colburn LLP; Vazken Alexanian

(57) ABSTRACT

Embodiments of the invention are directed to a method of forming a semiconductor device. A non-limiting example of the method includes forming a fin having a fin bottom region. A charged region is formed on a sidewall of the fin bottom region, wherein the charged region includes charged particles, and wherein the fin bottom region is formed from an undoped semiconductor material. The charged particles attract charge carriers in the fin bottom region toward and adjacent to the sidewall of the fin bottom region, wherein the charge carriers form a current path through the undoped semiconductor material of the fin bottom region.

20 Claims, 10 Drawing Sheets

(56) References Cited

U.S. PATENT DOCUMENTS

| | | |
|---|---|---|
| 2008/0050897 A1 | 2/2008 | Kottantharayil |
| 2011/0180871 A1* | 7/2011 | Anderson ......... H01L 27/10802 |
| | | 257/347 |
| 2014/0065799 A1* | 3/2014 | Ahmed ............... H01L 21/3003 |
| | | 438/477 |
| 2017/0373147 A1 | 12/2017 | Glass et al. |
| 2018/0145184 A1* | 5/2018 | Clifton ................ H01L 29/0673 |
| 2019/0172830 A1* | 6/2019 | Ok .................... H01L 29/66666 |
| 2019/0206743 A1* | 7/2019 | Zang .................. H01L 29/0847 |
| 2019/0267448 A1* | 8/2019 | Weber ................ H01L 29/0638 |

* cited by examiner

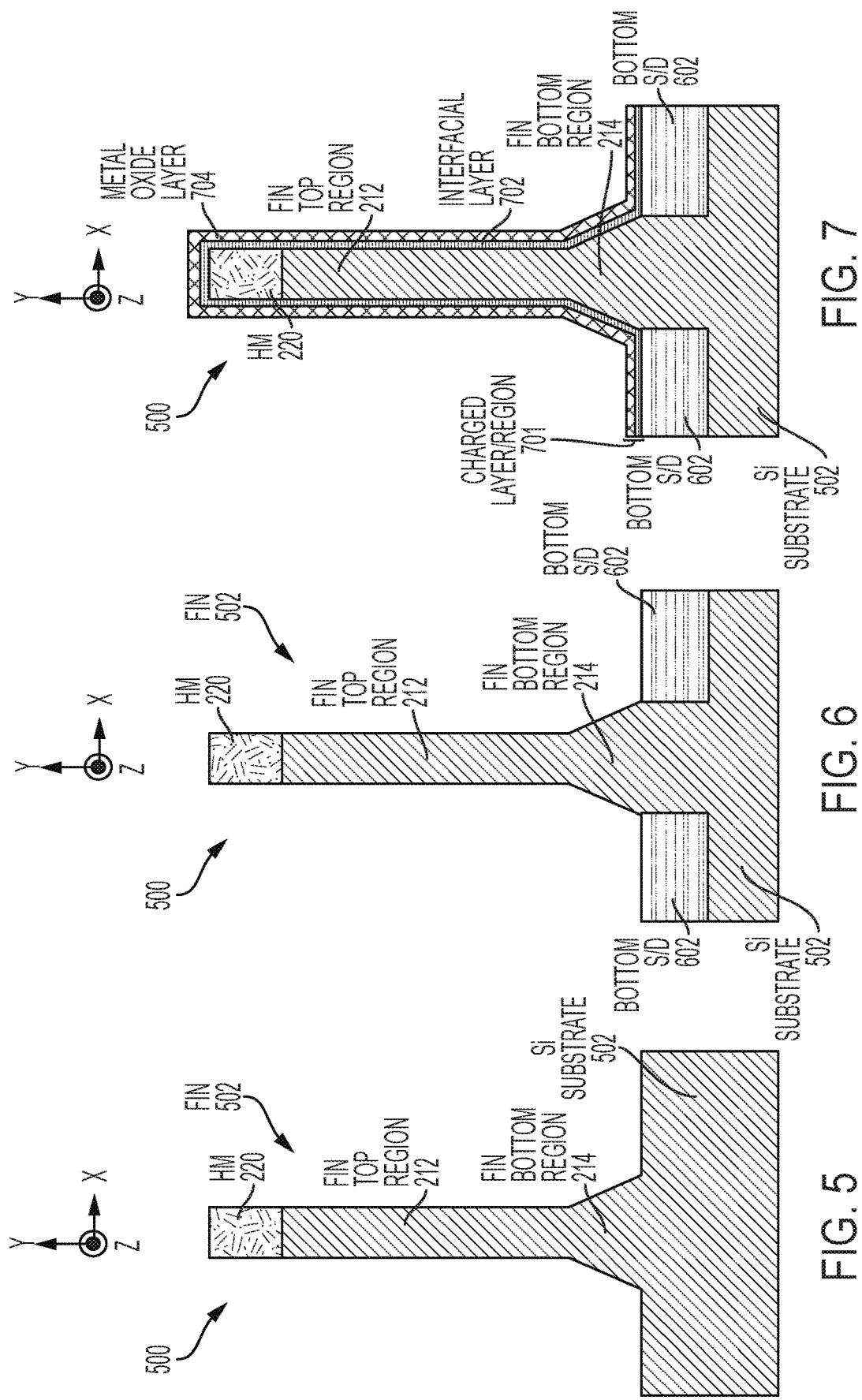

VERTICAL TRANSISTORS HAVING A LAYER OF CHARGE CARRIERS IN THE EXTENSION REGION FOR REDUCED EXTENSION REGION RESISTANCE

BACKGROUND

The present invention relates in general to semiconductor devices and their fabrication. More specifically, the present invention relates to improved fabrication methodologies and resulting structures for vertical field effect transistors (VFETs) configured and arranged to include a layer of charge carriers in the extension region of the channel fin, thereby reducing extension region resistance.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSTFETs is known as a planar device geometry in which the various parts of the MOSFET device are laid down as planes or layers.

A type of MOSFET is a non-planar FET known generally as a VFET. VFETs employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region. A gate is disposed on one or more of the fin sidewalls.

SUMMARY

Embodiments of the invention are directed to a method of forming a semiconductor device. A non-limiting example of the method includes forming a fin having a fin bottom region. A charged region is formed on a sidewall of the fin bottom region, wherein the charged region includes charged particles, and wherein the fin bottom region is formed from an undoped semiconductor material. The charged particles attract charge carriers in the fin bottom region toward and adjacent to the sidewall of the fin bottom region, wherein the charge carriers form a current path through the undoped semiconductor material of the fin bottom region.

Embodiments of the invention are directed to a method of forming a semiconductor device. A non-limiting example of the method includes forming a fin over a substrate, wherein the fin includes a fin bottom region and a fin top region, wherein the fin bottom region comprises an undoped semiconductor material. A bottom source or drain (S/D) region is formed in or on the substrate. A charged region is formed on a sidewall of the fin bottom region, and the charged region includes charged particles. A bottom spacer is formed over the bottom S/D region and adjacent to the charged region. A gate stack is formed on a sidewall of the fin top region. A top spacer is formed on the sidewall of the fin top region and over the gate stack. A top S/D region is formed on a top surface of the fin top region. The charged particles of the charged region attract charge carriers in the fin bottom region to the sidewall of the fin bottom region. The charge carriers form a fin bottom region current path configured to couple current from the bottom S/D region through the undoped semiconductor material of the fin bottom region and into the fin top region.

Embodiments of the invention are directed to a semiconductor device. A non-limiting example of the semiconductor device includes a fin having a fin bottom region, along with a charged region formed on a sidewall of the fin bottom region, wherein the charged region includes charged particles. The fin bottom region is formed from an undoped semiconductor material. The charged particles attract charge carriers in the fin bottom region toward and adjacent to the sidewall of the fin bottom region. The charge carriers form a current path through the undoped semiconductor material of the fin bottom region.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 5-16 depict cross-sectional views of a semiconductor structure after applying fabrication operations of a method for forming a final VFET semiconductor device having a charge carrier current path formed through a bottom extension region according to embodiments of the invention, in which:

FIG. 5 depicts a cross-sectional view of the semiconductor structure after fabrication operations according to embodiments of the invention;

FIG. 6 depicts a cross-sectional view of the semiconductor structure after fabrication operations according to embodiments of the invention;

FIG. 7 depicts a cross-sectional view of the semiconductor structure after fabrication operations according to embodiments of the invention;

FIG. 8 depicts a cross-sectional view of the semiconductor structure after fabrication operations according to embodiments of the invention;

FIG. 9 depicts a cross-sectional view of the semiconductor structure after fabrication operations according to embodiments of the invention;

FIG. 10 depicts a cross-sectional view of the semiconductor structure after fabrication operations according to embodiments of the invention;

FIG. 11 depicts a cross-sectional view of the semiconductor structure after fabrication operations according to embodiments of the invention;

FIG. 12 depicts a cross-sectional view of the semiconductor structure after fabrication operations according to embodiments of the invention;

FIG. 13 depicts a cross-sectional view of the semiconductor structure after fabrication operations according to embodiments of the invention;

FIG. 14 depicts a cross-sectional view of the semiconductor structure after fabrication operations according to embodiments of the invention;

FIG. 15 depicts a cross-sectional view of the semiconductor structure after fabrication operations according to embodiments of the invention; and FIG. 16 depicts a cross-sectional view of the semiconductor structure after fabrication operations to form the final VFET semiconductor device having a charge carrier current path formed at sidewalls of a fin bottom region according to embodiments of the invention.

Figure 1:
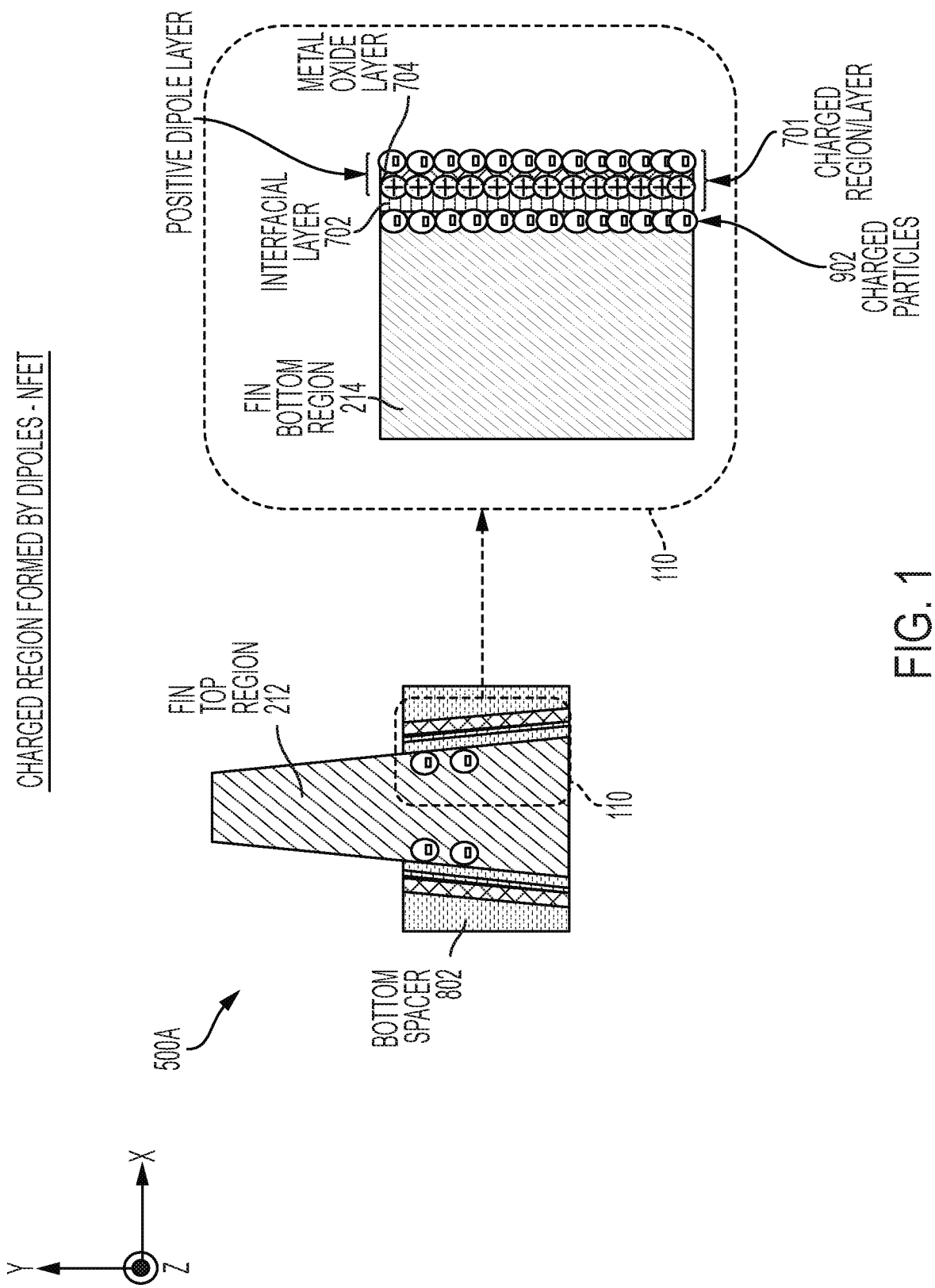
FIG. 1 depicts a cross-sectional view of a portion of a semiconductor structure having a charge carrier current path formed at sidewalls of a fin bottom region according to embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of VFET, implementation of the teachings recited herein are not limited to a particular type of VFET architecture or IC architecture. Rather embodiments of the present invention are capable of being implemented in conjunction with any other type of fin-based FET architecture or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, respectively, while a gate is disposed on and around one or more of the fin sidewalls.

A bottom junction is formed at the interface between the channel fin and the bottom source or drain (S/D) region, and a top junction is formed at the interface between the channel fin and the top S/D region. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting, for example, arsenic (As) or phosphorous (P). P-type devices can be formed by implanting, for example, boron (B). After implanting the necessary dopants in the S/D regions, a dopant drive-in anneal is applied to activate the dopants and drive (or diffuse) dopants further into the channel fin, thereby extending the junctions further into the channel fin. The regions that are doped by the dopant drive-in anneal are known generally as extension regions, and the junctions that are created by the dopant drive-in anneal are known generally as extension junctions.

In a VFET architecture, the active channel of the fin is surrounded by the gate, and the top/bottom S/D junctions must be positioned such the gate sufficiently overlaps the S/D junctions. If the gate does not sufficiently overlap the top/bottom S/D junctions (or extension junctions), external resistance (also known as extension resistance) is increased and overall transistor performance is degraded. Due to limitations in known semiconductor device processing capabilities, the bottom end of the fin can taper outward such that the fin's bottom end is wider than the fin's active channel region. Because the fin's bottom end is tapered, the anneal-based dopant drive-in cannot drive/diffuse enough dopants from the bottom S/D region to fill in the extra area created by the tapered bottom end. As a result, a portion of the bottom extension region remains undoped, the gate does not sufficiently overlap the bottom extension junction, and the resistance in the bottom extension region is increased, all of which degrade transistor performance.

Turning now to an overview of aspects of the invention, embodiments of the invention provide fabrication methodologies and resulting structures, wherein improved control over resistance in the bottom extension region is provided by forming a layer or sheet of charge carriers in the bottom extension region. In embodiments of the invention, the charge carrier layer/sheet is formed by attracting charged particles such that they are concentrated within an area that defines the layer/sheet. Within the layer/sheet, the charged particles are majority charge carriers capable of providing a conductive path through the layer/sheet for carrying current. In embodiments of the invention, the majority charge carriers can be free electrons (i.e., negative charge carriers) for n-type FET structures or free holes (i.e., positive charge carriers) for p-type FET structures. The charge carrier layer/sheet provides the conductive path through the bottom extension region even though portions of the bottom extension region remain undoped and the gate does not sufficiently laterally overlap the bottom extension junction.

In some embodiments of the invention, the charge carrier layer/sheet is formed adjacent to a sidewall of the bottom extension region. In some embodiments of the invention, the charge carrier layer/sheet is created by depositing a charged region/layer on the sidewall of the bottom extension region. The charged region/layer is configured to include charged particles that attract opposite polarity charged particles in the bottom extension region toward the bottom extension region sidewall, thereby creating the previously-described charge carrier layer/sheet. For n-type FET architectures where the majority carriers are electrons, the charge carriers in the charge carrier layer/sheet are electrons, and the charged particles in charged layer/region are positive charges. For p-type FET architecture where the majority carriers are holes, the charge carriers in the charge carrier layer/sheet are holes, and the charged particles in charged layer/region are negative charges.

In some embodiments of the invention, the charged particles in the charged layer/region are dipoles, and the charged layer/region includes a bi-layer structure formed from an interfacial layer and a metal oxide layer. The interfacial layer includes positive charges, and the metal oxide layer includes negative charges. The dipoles are pairs of charged particles formed from one of the positive charges in the positive charge layer separated from one of the negative charges in the negative charge layer by a predetermined distance. For NFET architectures where the majority carriers are electrons, the interfacial layer is formed on the sidewall of the bottom extension region, and the metal oxide layer is deposited on the interfacial layer. Thus, the positive charges of the dipoles attract negatively charged particles (e.g., electrons) in the bottom extension region toward and adjacent to the sidewall of the bottom extension region, thereby forming the previously-described charge carrier layer/sheet that provides the conductive path for current to flow through the undoped portion of the bottom extension region. In embodiments of the invention, the interfacial layer and the metal oxide layer are formed from materials that are known to generate dipoles when layered one on top of another. In NFET architectures, the interfacial layer can be formed from a variety of suitable dipole-forming materials, including, for example, $SiO_2$, $GeO_2$, and mixture thereof, and the metal oxide layer can be formed from a variety of suitable dipole-forming materials, including, for example, $Y_2O_3$, $Lu_2O_3$, $La_2O_3$, and SrO. For PFET architectures where the majority carriers are holes, the interfacial layer is formed on the sidewall of the bottom extension region, and the metal oxide layer is formed on the negative charge layer. Thus, the negative charges of the dipoles attract positively charged particles (e.g., holes) in the bottom extension region toward and adjacent to the sidewalls of the bottom extension, thereby forming the previously-described charge carrier layer/sheet that provides the conductive path for current to flow through the undoped portions of the bottom extension region. In PFET architectures, the interfacial layer can be formed from a variety of suitable dipole-forming materials, including, for example, $SiO_2$, $GeO_2$, and mixture thereof, and the metal oxide layer can be formed from a variety of suitable dipole-forming materials, including, for example, $Al_2O_3$, $TiO_2$.

In some embodiments of the invention, the charged particles in the charged region/layer are created by dopants in the charged region/layer. Based on the type of dopant used, the dopants either give off negatively charged particles (e.g., electrons) to the conduction band of the doped charged region/layer, or the dopants give off holes to the valence band of the doped charged region/layer. For NFET architectures where the majority carriers are electrons, the charged particles in the charged region/layer are positively charged, and the charged region/layer can be formed from a variety of suitable materials and dopants, including, for example, $SiO_2$ doped with nitrogen (N) or $GeO_2$ doped with N. Any suitable doping process can be used to dope the charged region/layer, including, for example, ion implantation or annealing the charged region/layer in an ambient that includes the dopant (e.g., N). For PFET architectures where the majority carriers are holes, the charged particles in the charged layer/region are negatively charged, and the charged layer/region can be formed from a variety of suitable materials and dopants, including, for example, $SiO_2$ doped with fluorine (F) or $GeO_2$ doped with F. Any suitable doping process can be used to dope the charged region/layer, including, for example, ion implantation or annealing the charged region/layer in an ambient that includes the dopant (e.g., F).

Turning now to a more detailed description of embodiments of the invention, FIG. 1 depicts a cross-sectional view of selected portions of a semiconductor structure 500A having a charge carrier current path defined by a layer/sheet of charged particles 902 extending through a fin bottom region 214 according to embodiments of the invention. When the fabrication operations are completed, the semiconductor structure 500A will form an n-type VFET device, an example of which is the final n-type VFET device 500C shown in FIG. 16. The selected portions of the semiconductor structure 500A shown in FIG. 1 include a fin formed from a fin top region 212 and a fin bottom region 214. The fin bottom region 214 will be the bottom extension region of the final VFET 500. Bottom spacers 802 are formed around the fin bottom region 214. To better illustrate aspects of the invention, a region 110 of the structure 500A having a layer/sheet of charged particles 902 and a charged region/layer 701 has been enlarged.

Due to limitations in known semiconductor device processing capabilities, the fin bottom region 214 tapers outward such that the fin bottom region 214 is wider than the fin top region 212. Because the fin bottom region 214 is tapered, the anneal-based dopant drive-in that is applied to the bottom S/D region (e.g., bottom S/D region 602 shown in FIG. 6) cannot drive/diffuse enough dopants from the bottom S/D region into the fin bottom region 214 to fill in the extra area created by the taper. As a result, even after the dopant drive-in, a portion of the fin bottom region 214 (i.e., the bottom extension region) remains undoped. If not addressed, the undoped fin bottom region 214 increases resistance in the bottom extension region and degrades transistor performance. Aspects of the invention overcome increased resistance in the fin bottom region 214 by providing a conductive path through the undoped material of the fin bottom region 214 (i.e., the bottom extension region). As shown in FIG. 1, the conductive path is provided by the layer/sheet of charged particles 902 formed adjacent to a sidewall of the fin bottom region 214. In accordance with aspects of the invention, the layer/sheet of charged particles 902 have been attracted toward sidewalls of the fin bottom region 214 such that the charged particles 902 are concentrated within an area that defines the layer/sheet. Within the layer/sheet of charged particles 902, the charged particles 902 function as majority charge carriers capable of providing a conductive path through the layer/sheet for carrying current through the fin bottom region 214.

In aspects of the invention, the layer/sheet of charged particles 902 is created by depositing a charged region/layer 701 on the sidewall of the fin bottom region 214 prior to forming the bottom spacers 802. The charged region/layer 701 is configured to include a bi-layer structure formed from an interfacial layer 702 and a metal oxide layer 704. The interfacial layer 702 includes positive charges, and the metal oxide layer 704 includes negative charges. The charged region/layer 701 forms dipoles from the positive charges in the interfacial layer 702 and negative charges in the metal oxide layer 704. More specifically, the dipoles are pairs of charged particles formed from one of the positive charges in the interfacial layer 702 separated from one of the negative charges in the metal oxide layer 704 by a predetermined distance. Because the semiconductor structure 500A will be an n-type FET architecture where the majority carriers are electrons, the interfacial layer 702 is formed on the sidewall of the fin bottom region 214, and the metal oxide layer 704 is deposited on the interfacial layer 702. Thus, the positive charges of the dipoles formed in the charge region/layer 701 attract negative charged particles 902 (e.g., electrons) in the fin bottom region 214 toward and adjacent to the sidewall of the fin bottom region 214, thereby forming the layer/sheet of charged particles 902 that provides a conductive path for current to flow through the fin bottom region 214. The interfacial layer 702 can be formed from a variety of suitable dipole-forming materials, including, for example, $SiO_2$, $GeO_2$, and mixture thereof, and the metal oxide layer 704 can be formed from a variety of suitable dipole-forming materials, including, for example, $Y_2O_3$, $Lu_2O_3$, $La_2O_3$, and SrO.

Figure 2:
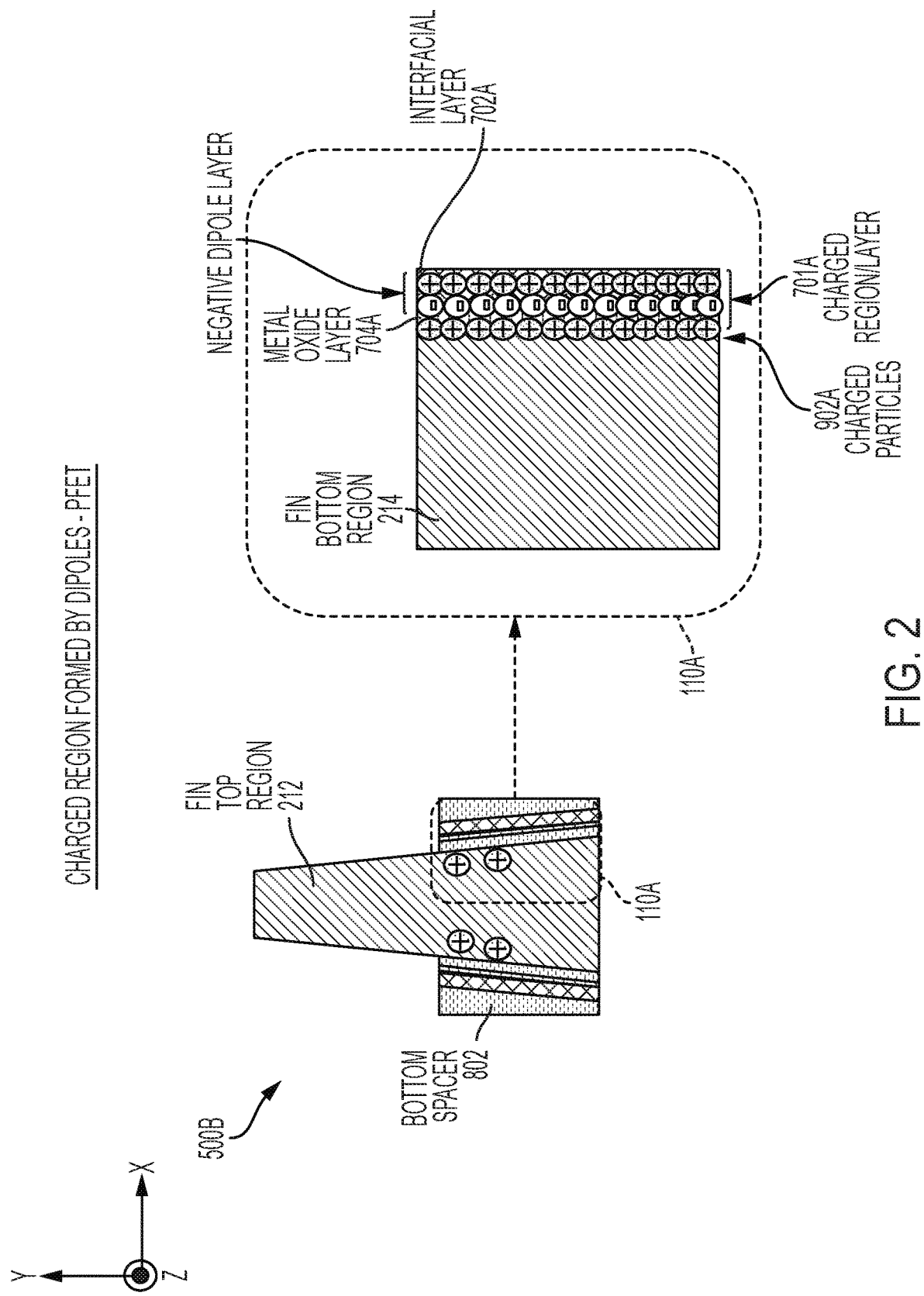
FIG. 2 depicts a cross-sectional view of a portion of another semiconductor structure having a charge carrier current path formed at sidewalls of a fin bottom region according to embodiments of the invention.

FIG. 2 depicts a cross-sectional view of selected portions of a semiconductor structure 500B having a charge carrier current path defined by a layer/sheet of charged particles 902A extending through the fin bottom region 214 according to embodiments of the invention. When fabrication operations are completed, the semiconductor structure 500B will form a p-type VFET device. As shown in FIG. 2, the selected portions of the semiconductor structure 500B include a fin formed from a fin top region 212 and a fin bottom region 214. The fin bottom region 214 will be the bottom extension region of the final p-type VFET device. Similar to the structure 500A (shown in FIG. 1), the fin bottom region 214 of the structure 500B is tapered such that the fin bottom region 214 is wider than the fin top region 212. Bottom spacers 802 are formed around the fin bottom region 214. To better illustrate aspects of the invention, a region 110A of the structure 500B having a layer/sheet of charged particles 902A and a charged region/layer 701A has been enlarged.

As shown in FIG. 2, the layer/sheet of charged particles 902A is formed adjacent to a sidewall of the fin bottom region 214 (i.e., the bottom extension region). In accordance with aspects of the invention, the layer/sheet of charged particles 902A has been attracted toward sidewalls of the fin bottom region 214 such that the charged particles 902A are concentrated within an area that defines the layer/sheet. Within the layer/sheet of charged particles 902A, the charged particles 902 function as majority charge carriers capable of providing a conductive path through the layer/sheet for carrying current through the fin bottom region 214.

In aspects of the invention, the layer/sheet of charged particles 902A is created by depositing a charged region/layer 701A on the sidewall of the fin bottom region 214 prior to forming the bottom spacers 802. The charged region/layer 701A is configured to include a bi-layer structure formed from an interfacial layer 704A and a metal oxide layer 702A. The interfacial layer 704A includes negative charges, and the metal oxide layer 702A includes positive charges. The charged region/layer 701A forms dipoles from the negative charges in the interfacial layer 704A and positive charges in the metal oxide layer 702A. More specifically, the dipoles are pairs of charged particles formed from one of the negative charges in the interfacial layer 704A separated from one of the positive charges in the metal oxide layer 702A by a predetermined distance. Because the semiconductor structure 500B will after fabrication is completed be a p-type FET architecture where the majority carriers are holes, the interfacial layer 704A is formed on the sidewall of the fin bottom region 214, and the metal oxide layer 702A is deposited on the interfacial layer 704A. Thus, the negative charges of the dipoles formed in the charge region/layer 701A attract positive charged particles 902A (e.g., holes) in the fin bottom region 214 toward and adjacent to the sidewall of the fin bottom region 214, thereby forming the layer/sheet of charged particles 902A that provides a conductive path for current to flow through the fin bottom region 214. The interfacial layer 704A can be formed from a variety of suitable dipole-forming materials, including, for example, $SiO_2$, $GeO_2$, and mixture thereof, and the metal oxide layer 702A can be formed from a variety of suitable dipole-forming materials, including, for example, $Al_2O_3$, $TiO_2$.

Figure 3:
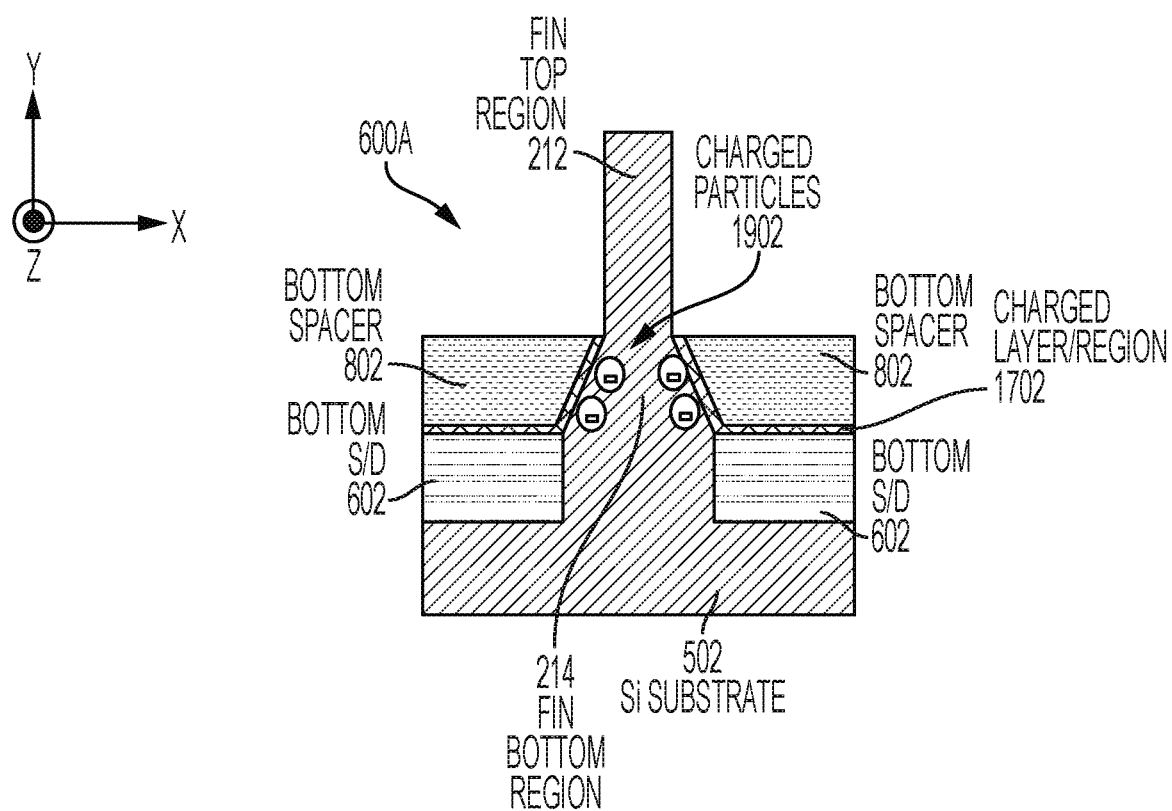
FIG. 3 depicts a cross-sectional view of a portion of another semiconductor structure having a charge carrier current path formed at sidewalls of a fin bottom region according to embodiments of the invention.

FIG. 3 depicts a cross-sectional view of selected portions of a semiconductor structure 600A having a charge carrier current path defined by a layer/sheet of charged particles 1902 extending through the fin bottom region 214 according to embodiments of the invention. When fabrication operations are completed, the semiconductor structure 600A will form an n-type VFET device, an example of which is the final n-type VFET device 500 shown in FIG. 16. As shown in FIG. 3, the selected portions of the semiconductor structure 600A include a fin formed from a fin top region 212 and a fin bottom region 214. The fin bottom region 214 will be the bottom extension region of the final p-type VFET device. Similar to the structure 500A (shown in FIG. 1), the fin bottom region 214 of the structure 600A is tapered such that the fin bottom region 214 is wider than the fin top region 212. Bottom spacers 802 are formed around the fin bottom region 214, and bottom S/D regions 602 are formed in a substrate 502.

In aspects of the invention, the layer/sheet of charged particles 1902 is created by depositing a charged region/layer 1702 on the sidewall of the fin bottom region 214 prior to forming the bottom spacers 802. In embodiments of the invention, the charged layer/region 1702 includes charged particles (not shown) created by dopants in the charged region/layer 1702. Based on the type of dopant used, the dopants either give off negatively charged particles (e.g., electrons) to the conduction band of the doped charged region/layer 1702, or the dopants give off holes to the valence band of the doped charged region/layer 1702. For the n-type FET architecture shown in FIG. 3, the majority carriers are electrons, the charged particles in the charged region/layer 1702 are positively charged, and the region/layer 1702 can be formed from a variety of suitable materials and dopants, including, for example, $SiO_2$ doped with nitrogen (N) or $GeO_2$ doped with N. Any suitable doping process can be used to dope the charged region/layer 1702, including, for example, ion implantation.

Figure 4:
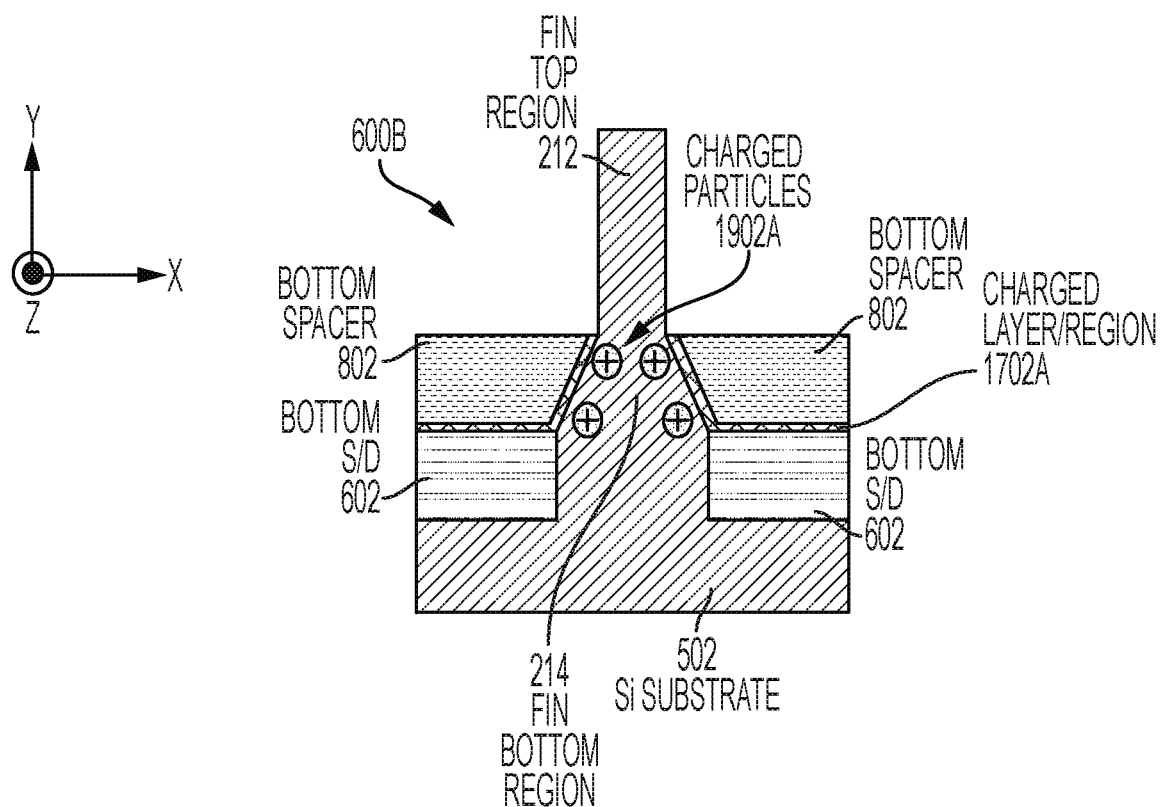
FIG. 4 depicts a cross-sectional view of a portion of another semiconductor device having a charge carrier current path formed at sidewalls of a fin bottom region according to embodiments of the invention.

FIG. 4 depicts a cross-sectional view of selected portions of a semiconductor structure 600B having a charge carrier current path defined by a layer/sheet of charged particles 1902A extending through the fin bottom region 214 according to embodiments of the invention. When fabrication operations are completed, the semiconductor structure 600B will form a p-type VFET device. As shown in FIG. 4, the selected portions of the semiconductor structure 600B include a fin formed from a fin top region 212 and a fin bottom region 214. The fin bottom region 214 will be the bottom extension region of the final n-type VFET device. Similar to the structure 500A (shown in FIG. 1), the fin bottom region 214 of the structure 600B is tapered such that the fin bottom region 214 is wider than the fin top region 212. Bottom spacers 802 are formed around the fin bottom region 214, and bottom S/D regions 602 are formed in a substrate 502.

In aspects of the invention, the layer/sheet of charged particles 1902A is created by depositing a charged region/layer 1702A on the sidewall of the fin bottom region 214 prior to forming the bottom spacers 802. In embodiments of the invention, the charged layer/region 1702A includes charged particles (not shown) created by dopants in the charged region/layer 1702A. Based on the type of dopant used, the dopants either give off negatively charged particles (e.g., electrons) to the conduction band of the doped charged region/layer 1702A, or the dopants give off holes to the valence band of the doped charged region/layer 1702A. For the p-type FET architecture shown in FIG. 4, the majority carriers are holes, the charged particles in the charged region/layer 1702A are negatively charged, and the charged layer/region 1702A can be formed from a variety of suitable materials and dopants, including, for example, $SiO_2$ doped with fluorine (F) or $GeO_2$ doped with F. Any suitable doping process can be used to dope the charged region/layer 1702A, including, for example, annealing the charged region/layer 1702A in an ambient that includes the dopant (e.g., F).

FIGS. 5-16 depict two-dimensional (2D) cross-sectional views of a semiconductor structure 500 after fabrication operations of a method for forming a final n-type VFET semiconductor device 500C (shown in FIG. 16) having a charge carrier current path (e.g., layer/sheet of charged particles 902 shown in FIG. 9) formed at sidewalls of the fin bottom region 214 according to embodiments of the invention. The fabrication operations depicted in FIGS. 5-16 apply equally to the fabrication of a p-type VFET in accordance with aspects of the invention with the appropriate polarity changes for the p-type structure. As shown in FIG. 5, known semiconductor fabrication operations have been used to form the semiconductor structure 500 having a substrate 502 and a fin 502 that includes a fin top region 212, a fin bottom region 214, and a hardmask 220. With reference to the X/Y/Z diagrams depicted in the figures, the various elements that form the semiconductor structure 500 extend along a first axis (e.g., X-axis) to define width dimensions, and extend along a second axis (e.g., Y-axis) perpendicular to the X-axis to define height (or thickness) dimensions. Although not specifically depicted in the 2D cross-sectional views shown in FIGS. 5-16, the various elements that form the semiconductor structure 500 and/or the final n-type VFET device 500C (shown in FIG. 16) also extend along a third axis (e.g., Z-axis) perpendicular to the first axis and the second axis to define depth dimensions. In accordance with standard VFET architectures, various elements of the semiconductor structures 500 and the n-type VFET 500C (e.g., bottom spacer 802, interfacial layer 1002, high-k dielectric 1004, WFM 1006, etc.) extend completely around the sidewalls of the fin 502 in the X, Y, and Z directions.

The substrate 502 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 502 includes a buried oxide layer (not depicted).

The fin 502 can be formed by depositing a hard mask layer (not shown) over the substrate 502 using any suitable deposition process. The hard mask layer can be a dielectric such as silicon nitride (SiN), silicon oxide, or a combination of silicon oxide and silicon nitride. Conventional semiconductor device fabrication processes (e.g., patterning and lithography, self-aligned double patterning, self-aligned quadruple patterning) are used to remove portions of the substrate 502 and the hard mask layer to form the fin 502 and the hard mask 220. For example, the hard mask layer can be patterned to expose portions of the substrate 502. The exposed portions of the substrate 502 can then be removed or recessed using, for example, a wet etch, a dry etch, or a combination thereof, to thereby form the fin 502 and the hard mask 220. Due to limitations in known semiconductor device processing capabilities, the fin bottom region 214 tapers outward such that the fin bottom region 214 is wider than the fin top region 212. The fin 502 can be electrically isolated from other regions of the substrate 502 by a shallow trench isolation region (not depicted). The shallow trench isolation region can be of any suitable dielectric material, such as, for example, a silicon oxide.

In FIG. 6, known fabrication operations have been used to form a bottom S/D region 602 in the substrate 502. In some embodiments of the invention, the bottom S/D region 602 can be formed later in the fabrication process. In some embodiments of the invention, the bottom S/D region 602 is epitaxially grown, and the necessary doping to form the bottom S/D region 204 is provided through in-situ doping during the epitaxial growth process, or through ion implantation after the bottom S/D region 204 is formed. The bottom S/D region 602 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

After providing the necessary dopants in the bottom S/D regions 602, a dopant drive-in anneal is applied to activate the dopants and drive (or diffuse) dopants further into the fin bottom region 214, thereby extending the junctions formed at the SD region/fin interface further into the fin bottom region 214. The regions of the fin bottom channel 214 that are doped by the dopant drive-in anneal are known generally as extension regions, and the junctions that are created by the dopant drive-in anneal are known generally as extension junctions. Because the fin bottom region 214 is tapered, the anneal-based dopant drive-in that is applied to the bottom S/D regions 602 cannot drive/diffuse enough dopants from the bottom S/D regions 602 into the fin bottom region 214 to fill in the extra area created by the taper. As a result, even after the dopant drive-in, a portion of the fin bottom region 214 (i.e., the bottom extension region) remains undoped.

In FIG. 7, known fabrication operations have been used to conformally deposit a charged layer/region 701 over the semiconductor structure 500. In embodiments of the invention, the charged layer/region 701 is a bi-layer structure having an interfacial layer 702 and a metal oxide layer 704. The interfacial layer 702 includes positive charges, and the metal oxide layer 704 includes negative charges for n-type FET. The charged region/layer 701 forms dipoles from the positive charges in the interfacial layer 702 and negative charges in the metal oxide layer 704. More specifically, the dipoles are pairs of charged particles formed from one of the positive charges in the interfacial layer 702 separated from one of the negative charges in the metal oxide layer 704 by a predetermined distance. Because the semiconductor structure 500 will be an n-type FET architecture where the majority carriers are electrons, the interfacial layer 702 is deposited over the structure 500, and the metal oxide layer 704 is deposited on the interfacial layer 702. Thus, the positive charges of the dipoles formed in the charge region/layer 701 attract negative charged particles 902 (shown in FIG. 9) in the fin bottom region 214 toward and adjacent to the sidewall of the fin bottom region 214, thereby forming the layer/sheet of charged particles 902 that provides a conductive path for current to flow through the fin bottom region 214. The interfacial layer 702 can be formed from a variety of suitable dipole-forming materials, including, for example, $SiO_2$, $GeO_2$, and mixture thereof, and the metal oxide layer 704 can be formed from a variety of suitable dipole-forming materials, including, for example, $Y_2O_3$, $Lu_2O_3$, $La_2O_3$, and SrO.

Figure 8:
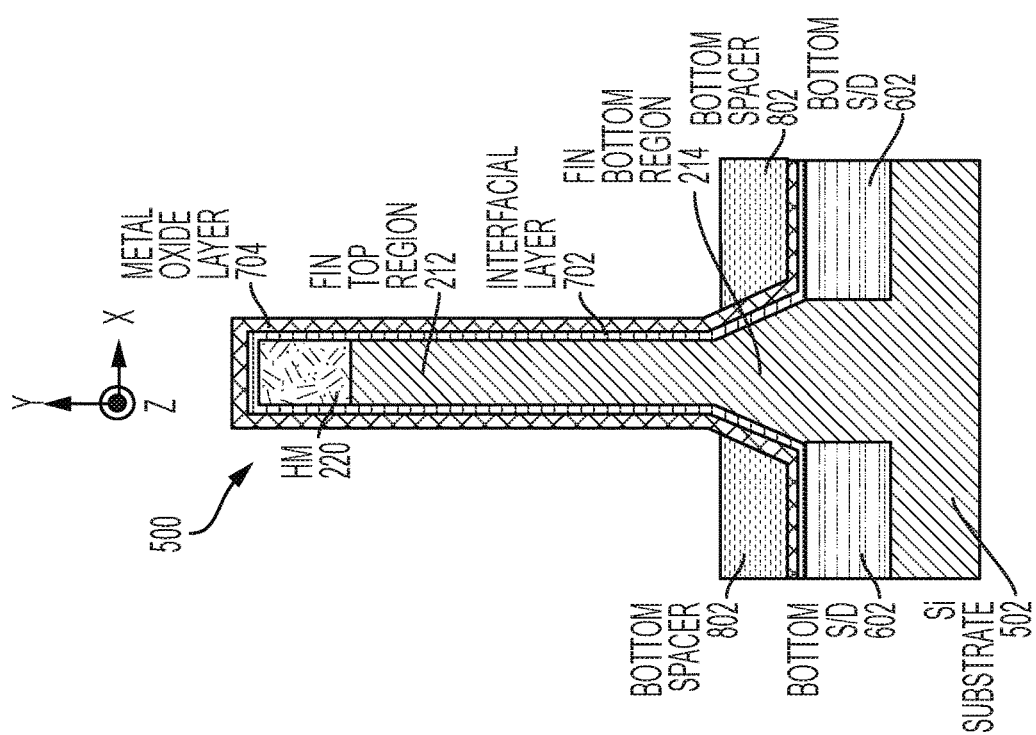

In FIG. 8, known fabrication operations have been used to form the bottom spacers 802 over the charged region/layer 701 and across from the fin bottom region 214. The bottom spacers 802 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The bottom spacers 802 can be formed using known deposition processes, such as, for example, CVD, PECVD, ALD, PVD, chemical solution deposition, or other like processes.

Figure 9:
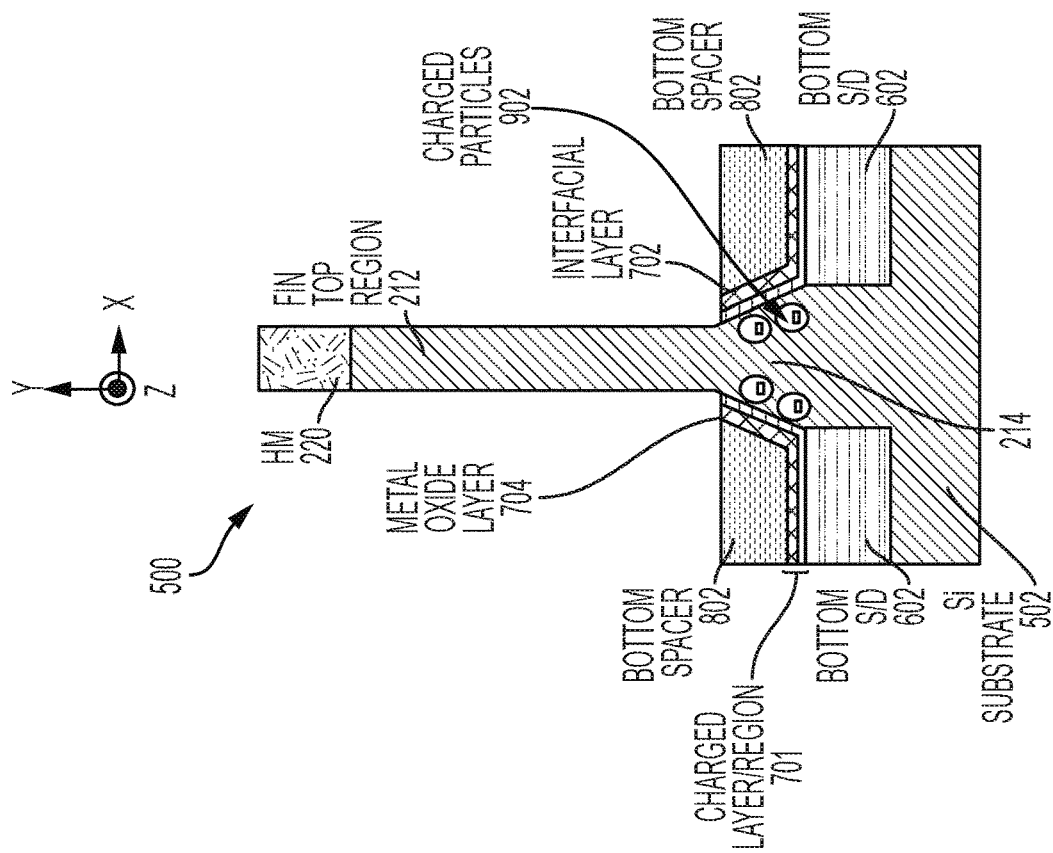

In FIG. 9, known fabrication operations have been used to selectively remove the metal oxide layer 704 and the interfacial layer 702 from the fin top region 212 and the hard mask 220.

Figure 10:
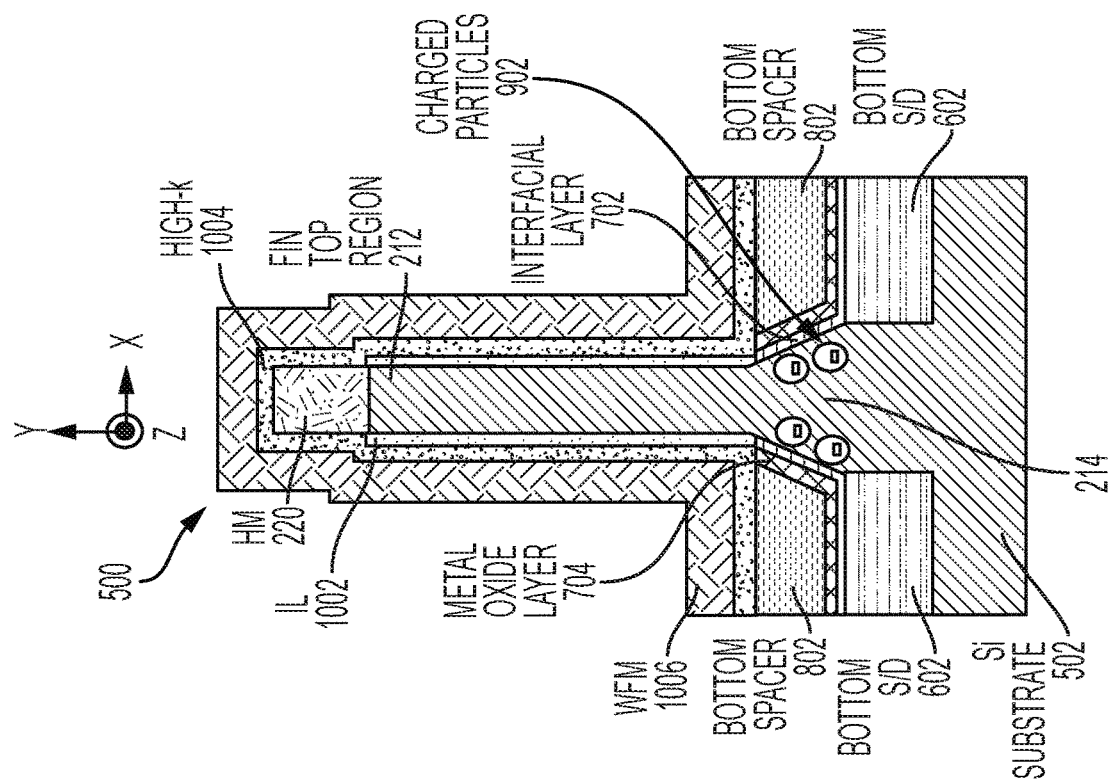

In FIG. 10, an interfacial layer 1002, a high-k dielectric 1004, and a work function metal (WFM) 1006 have been deposited over the bottom spacers 802, the fin top region 212, and the hard mask 220. The high-k dielectric layer 1004 can be formed from one or more films, examples of which include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric layer 1004 can further include dopants such as, for example, lanthanum and aluminum. The dielectric layers 1002, 1004 can be formed by suitable deposition processes, for example, CVD, PECVD, atomic layer deposition (ALD), evaporation, physical vapor deposition (PVD), chemical solution deposition, or other like processes. The thickness of the dielectric layers 1002, 1004 can vary depending on the deposition process as well as the composition and number of high-k dielectric materials used.

The WFM 1006 can be deposited over the dielectric layers 1002, 1004 by a suitable deposition process, for example, ALD, CVD, PECVD, PVD, plating, thermal or e-beam evaporation, and sputtering. The type of WFM depends on the type of transistor and can differ between the nFET and pFET devices. P-type WFMs include compositions such as titanium nitride, tungsten, ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof.

Figure 11:
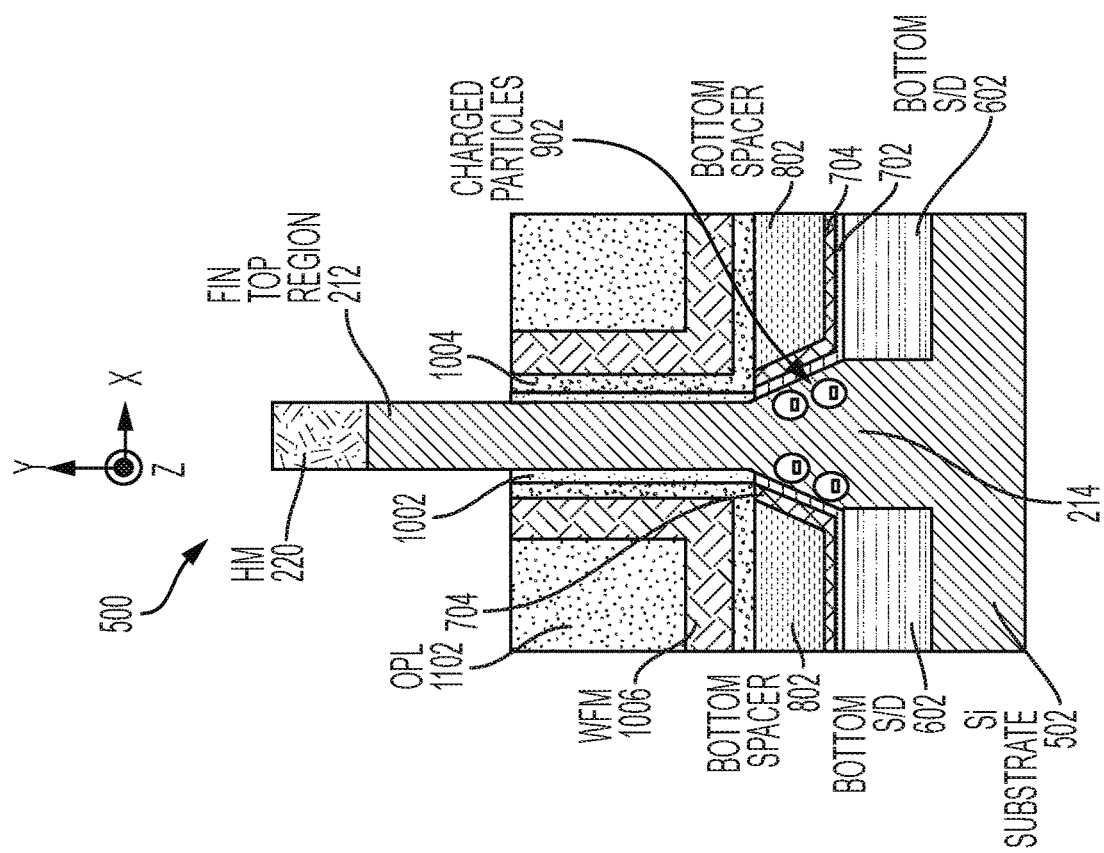

In FIG. 11, known fabrication operations have been used to deposit an organic planarization layer (OPL) 1102 over the structure 500. In general, OPLs are used as etch masks for pattern transfers into inorganic substrates, to fill pre-existing features, and to planarize the substrate to allow for larger patterning process windows. After the OPL 1102 has been deposited, known fabrication operations have been used to recess the interlayer dielectric 1002, the high-k dielectric 1004, the WFM 1106, and the OPL 1102 to a level below a top surface of the fin top region 212 using, for example, etching process.

Figure 12:
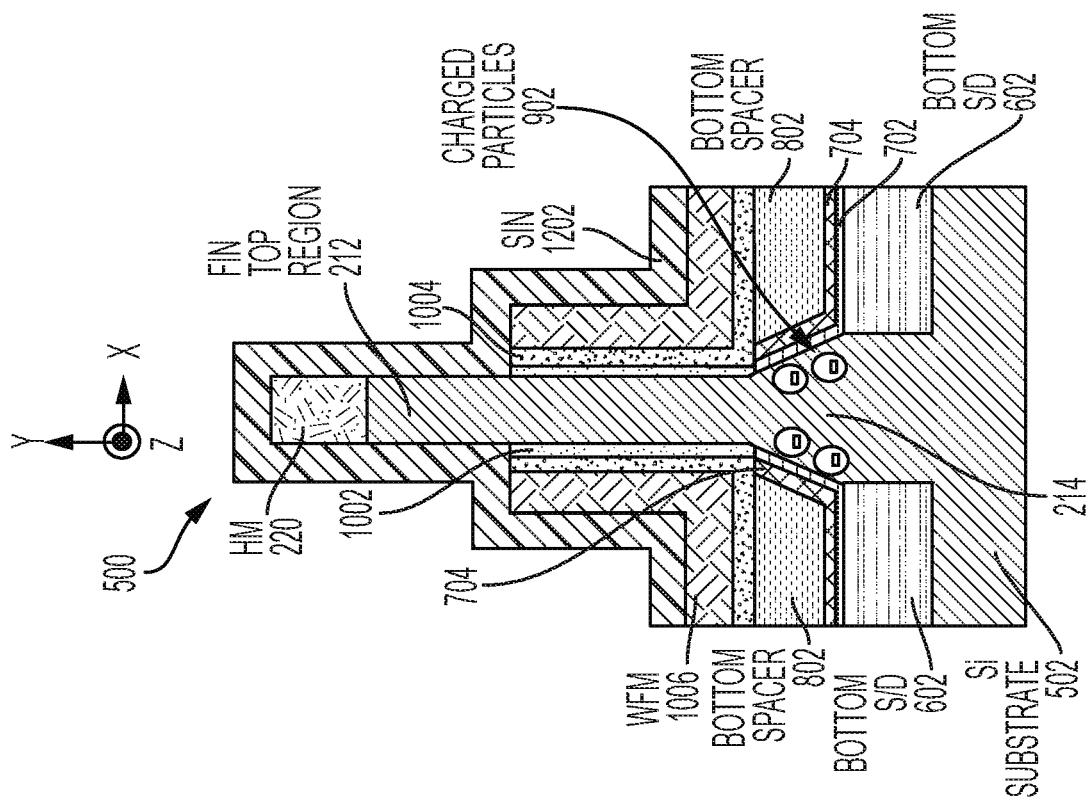

In FIG. 12, known fabrication operations have been used to conformally deposit an encapsulating layer 1202 over the structure 500. The encapsulating layer 1202 includes a portion positioned over the WFM 1006 and adjacent to the fin top region 212 will function as the top spacer of the final n-type VFET 500C (shown in FIG. 16). The encapsulating layer 1202 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The encapsulating layer 1202 can be formed using known deposition processes, such as, for example, CVD, PECVD, ALD, PVD, chemical solution deposition, other directional deposition techniques, or other like processes.

Figure 13:
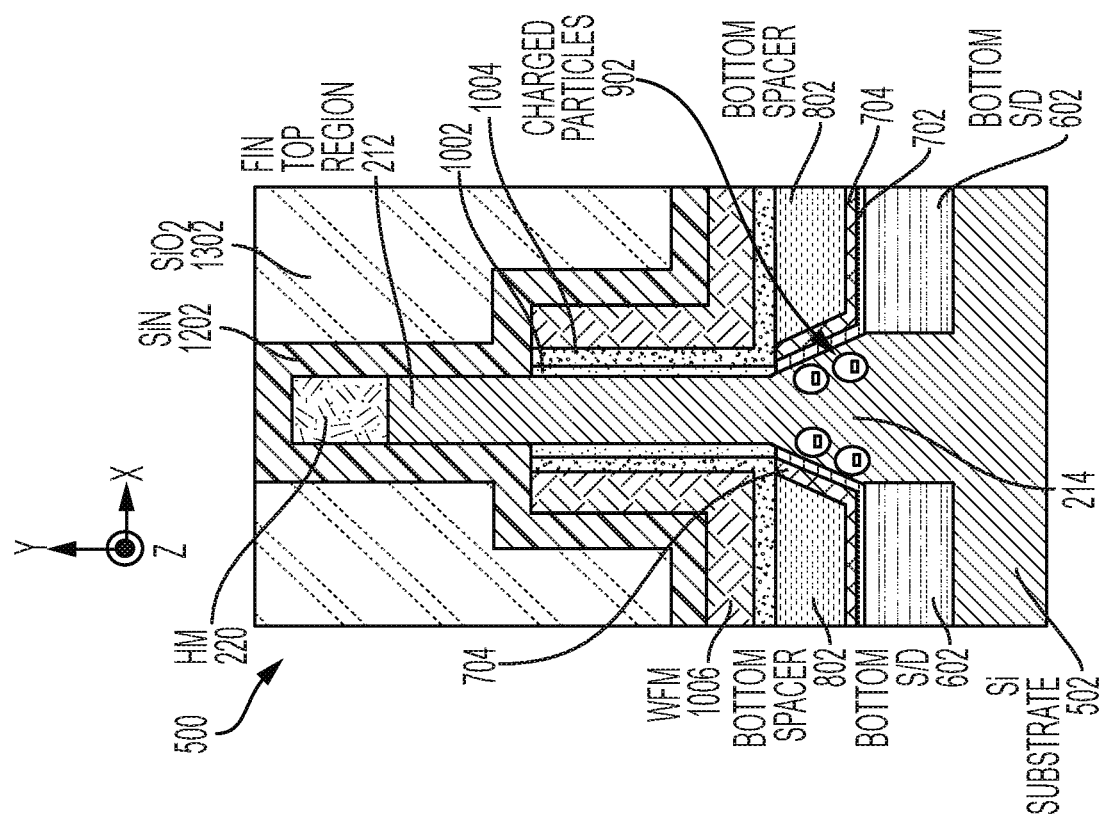

In FIG. 13, known fabrication operations have been used to deposit an interlayer dielectric (ILD) material 1302 over the over the structure 500. In embodiments of the invention, the ILD material 1302 can be any suitable material, including, for example, $SiO_2$. After the ILD material 1302 has been deposited, known fabrication operations have been used to planarize the structure 500 using, for example, CMP.

Figure 14:
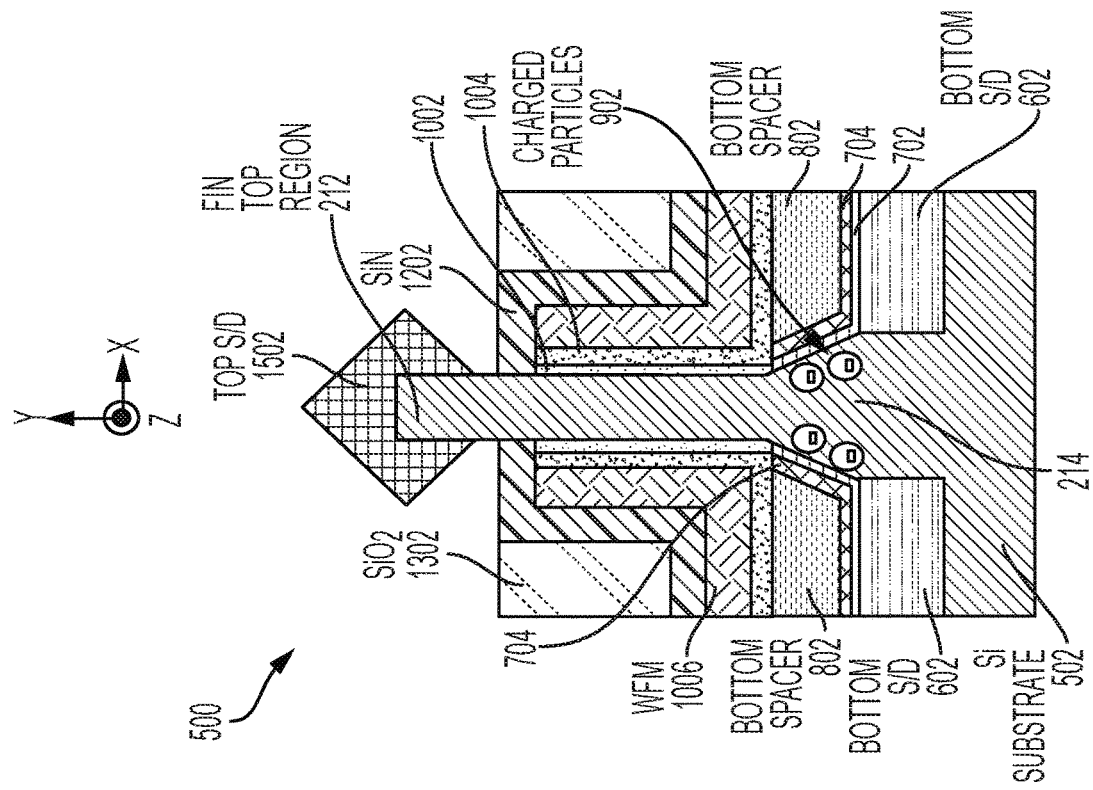

In FIG. 14, known fabrication operations have been used to recess the fill-in material 1302 and the encapsulation layer 1202 to a level below a top surface of the fin top region 212 using, for example, etching process. The recess operations also remove the hard mask 220.

Figure 15:
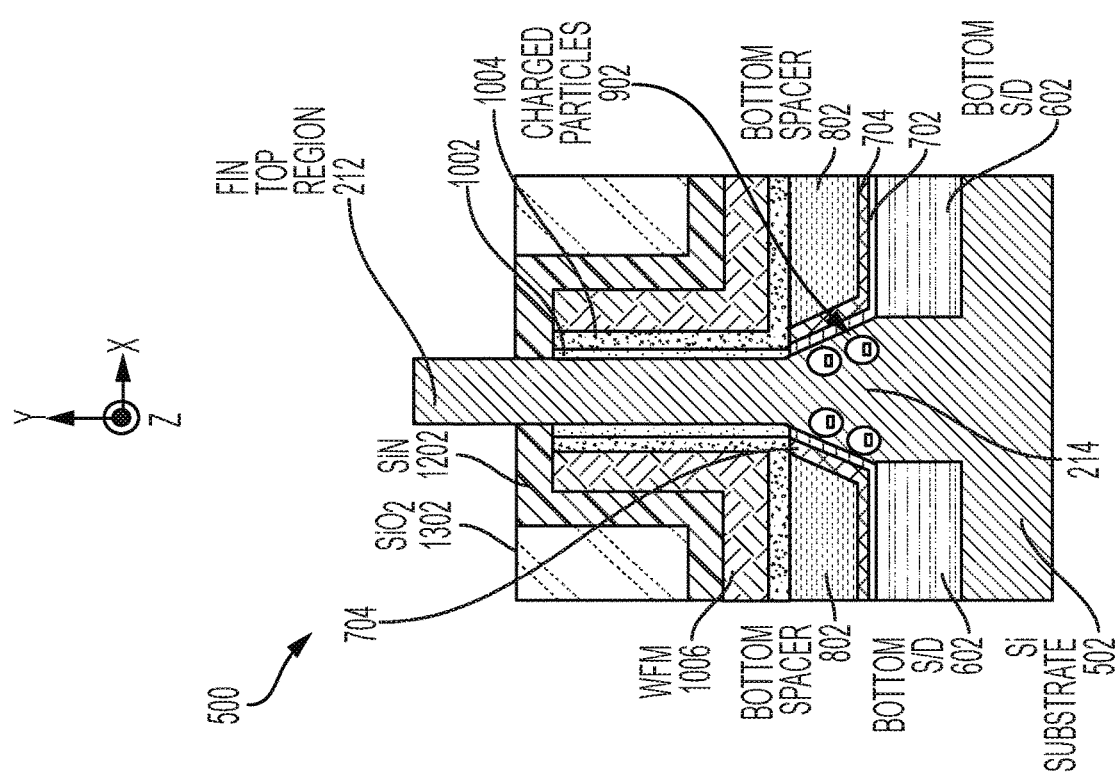

In FIG. 15, known fabrication operations have been used to form a top S/D region 1502 on the top surface and exposed sidewalls of the fin top region 212. In embodiments of the invention, the top S/D region 1502 is epitaxially grown, and the necessary doping to form the top S/D region 1502 is provided through in-situ doping during the epitaxial growth process, or through ion implantation after the top S/D region 1502 is formed. The top S/D region 1502 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Figure 16:
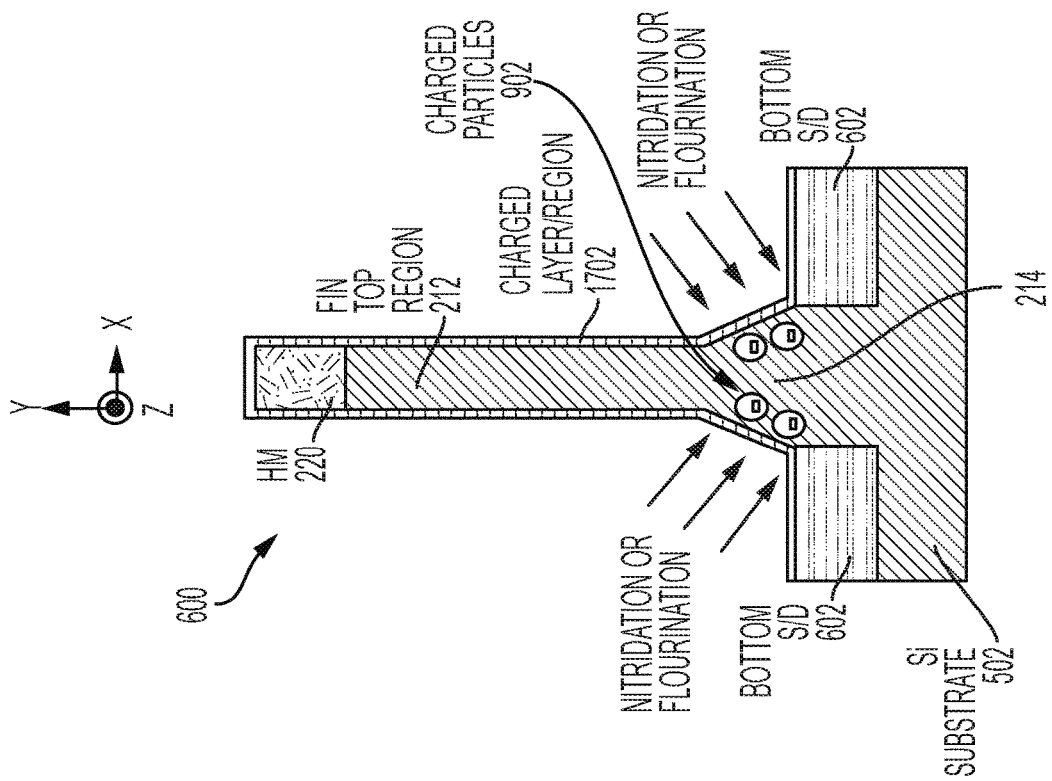

In FIG. 16, known fabrication operations have been used to deposit an additional layer of the encapsulation material 1202, along with additional ILD material 1302A over the additional layer of encapsulation material 1202. A S/D contact 1602 is formed in the ILD material 1302A to contact the top S/D region 1502. In embodiments of the invention, the S/D contact 1602 can be formed by forming a trench in the ILD material 1302A. The trench is positioned over the top S/D region 1502 to which electrical coupling will be made. A liner/barrier material is deposited within the trench, and the remaining trench volume is filled with copper using, for example, a chemical/electroplating process, to thereby form the S/D contact 1602. The excess copper is removed to form a flat surface for subsequent processing. A cap layer (not shown) can be deposited over the exposed top surface of the S/D contact 1602.

Figure 17:
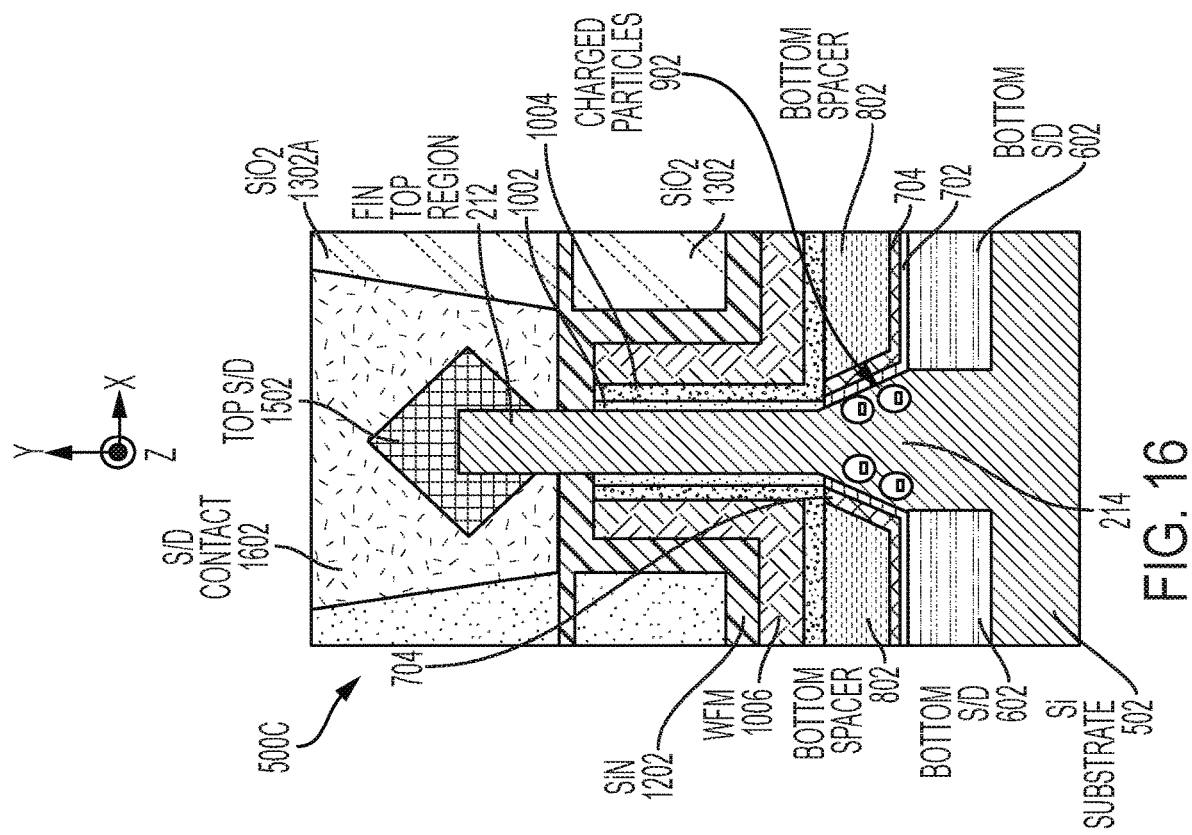
FIG. 17 depicts a cross-sectional view of another semiconductor structure after applying fabrication operations of a method for forming a final VFET semiconductor device having a charge carrier current path formed through a bottom extension region according to embodiments of the invention.

FIG. 17 depicts a 2D cross-sectional views of a semiconductor structure 600 after fabrication operations of a method for forming a final n-type VFET device having a charge carrier current path embodied in a layer/sheet of charged particles 1902 formed at sidewalls of the fin bottom region 214 according to embodiments of the invention. The fabrication operations depicted in FIG. 17 apply equally to the fabrication of a p-type VFET in accordance with aspects of the invention with the appropriate polarity changes for the p-type structure. As shown in FIG. 15, the fabrication operations shown in FIGS. 1 and 2 have been used to form the semiconductor device 600 having a substrate 502, a fin top region 212, a fin bottom region 214, a hard mask 220, and bottom S/D regions 602, configured and arranged as shown. The structure 600 differs from the structure 500 (shown in FIGS. 1-15) in that, at the fabrication stage shown in FIG. 17, a charged layer/region 1702 is deposited over the structure 600.

In some embodiments of the invention, the layer/sheet of charged particles 1902 is created by depositing the charged region/layer 1702 on the sidewall of the fin bottom region 214. The charged region/layer 1702 is configured to include charged particles that attract opposite polarity charged particles in the fin bottom region 214 toward the sidewall of the fin bottom region 214, thereby creating the layer/sheet of charged particles 1902. For n-type FET architectures where the majority carriers are electrons, the charge carriers in the charge carrier layer/sheet are electrons, and the charged particles in charged layer/region are positively charged. For p-type FET architectures where the majority carriers are holes, the charge carriers 1902 in the charge carrier layer/sheet are holes, and the charged particles in charged layer/region 1702 are negatively charged.

In embodiments of the invention, the charged layer/region 1702 includes charged particles (not shown) created by dopants in the charged region/layer 1702. Based on the type of dopant used, the dopants either give off negatively charged particles (e.g., electrons) to the conduction band of the doped charged region/layer 1702, or the dopants give off holes to the valence band of the doped charged region/layer 1702. For the n-type FET architecture shown in FIG. 17, the majority carriers are electrons, the charged particles in the charged region/layer 1702 are positively charged, and the charged region/layer 1702 can be formed from a variety of suitable materials and dopants, including, for example, $SiO_2$ doped with nitrogen (N) or $GeO_2$ doped with N. Any suitable doping process can be used to dope the charged region/layer 1702, including, for example, ion implantation or a nitridation process that includes annealing the charged region/layer 1702 in an ambient that includes the dopant (e.g., N).

In embodiments of the invention where the final VFET is a p-type FET, the majority carriers are holes, the charged particles (e.g., electrons) in the charged region/layer 1702 are negatively charged, and the charged layer/region 1702 can be formed from a variety of suitable materials and dopants, including, for example, $SiO_2$ doped with fluorine (F) or $GeO_2$ doped with F. Any suitable doping process can be used to dope the charged region/layer 1702, including, for example, ion implantation or a fluorination process that includes annealing the charged region/layer 1702 in an ambient that includes the dopant (e.g., F).

The remaining fabrication operations used to complete the structure 600 are the same fabrication operations shown in FIGS. 8-16, wherein the charged region/layer 701 is replaced with the charged region/layer 1702 (shown in FIG. 17).

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a fin having a fin bottom region;
    forming a charged region on a sidewall of the fin bottom region;
    wherein the charged region comprises charged particles;
    wherein the fin bottom region comprises an undoped semiconductor material;
    wherein the charged particles concentrate charge carriers in the fin bottom region such that:
        the fin bottom region includes a concentrated charge carrier region and a non-concentrated charge carrier region; and
        there are more charge carriers in the concentrated charge carrier region than the non-concentrated charger carrier region; and
    wherein the concentrated charge carrier region forms a current path through the undoped semiconductor material of the fin bottom region.

2. The method of claim 1, wherein:
    the charged particles comprise dipoles;
    the charged region comprises:
        an interfacial layer comprising positive charges; and
        a metal oxide layer adjacent to the interfacial layer, the metal oxide layer comprising negative charges;
    the dipoles comprise the positive charges separated from the negative charges by a predetermined distance; and
    the charge carriers comprise electrons.

3. The method of claim 2, wherein the interfacial layer comprises a material selected from the group consisting of $SiO_2$ and $GeO_2$.

4. The method of claim 2, wherein the metal oxide layer comprises a material selected from the group consisting of $Y_2O_3$, $Lu_2O_3$, $La_2O_3$, and $SrO$.

5. The method of claim 1, wherein:
    the charged particles comprise dipoles;
    the charged region comprises:
        an interfacial layer comprising positive charges; and
        a metal oxide layer adjacent the interfacial layer, the metal oxide layer comprising negative charges;
    the dipoles comprise the positive charges separated from the negative charges by a predetermined distance; and
    the charge carriers comprise holes.

6. The method of claim 5, wherein the interfacial layer comprises a material selected from the group consisting of $SiO_2$ and $GeO_2$.

7. The method of claim 5, wherein the metal oxide layer comprises a material selected from the group consisting of $Al_2O_3$ and $TiO_2$.

8. The method of claim 1, wherein the charged particles are attracted by a dopant in the charged region.

9. The method of claim 8 further comprising implanting the dopant in the charged region.

10. The method of claim 8 further comprising doping the charged region with the dopant by annealing the fin bottom region in an ambient comprising the dopant.

11. A method of forming a semiconductor device, the method comprising:
    forming a fin over a substrate;
    wherein the fin comprises a fin bottom region and a fin top region;
    wherein the fin bottom region comprises an undoped semiconductor material;
    forming a bottom source or drain (S/D) region in or on the substrate;
    forming a charged region on a sidewall of the fin bottom region, the charged region comprising charged particles;
    forming a bottom spacer over the bottom S/D region and adjacent to the charged region;
    forming a gate on a sidewall of the fin top region;
    forming a top spacer on the sidewall of the fin top region and over the gate;
    forming a top S/D region on a top surface of the fin top region;
    wherein the charged particles of the charged region concentrate charge carriers in the fin bottom region such that:
        the fin bottom region includes a concentrated charge carrier region and a non-concentrated charge carrier region; and
        there are more charge carriers in the concentrated charge carrier region than the non-concentrated charger carrier region; and
    wherein the concentrated charge carrier region forms a fin bottom region current path configured to couple current from the bottom S/D region through the undoped semiconductor material of the fin bottom region and into the fin top region.

12. The method of claim 11, wherein:
the charged particles comprise dipoles;
the charged region comprises:
- an interfacial layer comprising positive charges; and
- a metal oxide layer adjacent to the interfacial layer, the metal oxide layer comprising negative charges; and the dipoles comprise the positive charges separated from the negative charges by a predetermined distance.

13. The method of claim 12, wherein:
the charge carriers comprise electrons;
the interfacial layer comprises a material selected from the group consisting of $SiO_2$ and $GeO_2$; and
the metal oxide layer comprises a material selected from the group consisting of $Y_2O_3$, $Lu_2O_3$, $La_2O_3$, and SrO.

14. The method of claim 12, wherein:
the charge carriers comprise holes;
the interfacial layer comprises a negative charge layer material selected from the group consisting of $SiO_2$ and $GeO_2$; and
the metal oxide layer comprises a material selected from the group consisting of $Al_2O_3$ and $TiO_2$.

15. The method of claim 11 further comprising implanting a dopant in the charged region, wherein the charged particles are attracted by the dopant in the charged region.

16. The method of claim 11 further comprising doping the charged region with a dopant by annealing the fin bottom region in an ambient comprising the dopant.

17. A semiconductor device comprising:
a fin having a fin bottom region;
a charged region formed on a sidewall of the fin bottom region;
wherein the charged region comprises charged particles;
wherein the fin bottom region comprises an undoped semiconductor material;
wherein the charged particles concentrate charge carriers in the fin bottom region such that:
- the fin bottom region includes a concentrated charge carrier region and a non-concentrated charge carrier region; and
- there are more charge carriers in the concentrated charge carrier region than the non-concentrated charger carrier region; and wherein the concentrated charge carrier region forms a current path through the undoped semiconductor material of the fin bottom region.

18. The device of claim 17, wherein:
the charged particles comprise dipoles;
the charged region comprises:
- an interfacial layer comprising positive charges; and
- a metal oxide layer adjacent to the interfacial layer, the metal oxide layer comprising negative charges;

the dipoles comprise the positive charges separated from the negative charges by a predetermined distance;
the charge carriers comprise electrons;
the interfacial layer comprises a material selected from the group consisting of $SiO_2$ and $GeO_2$; and
the metal oxide layer comprises a material selected from the group consisting of $Y_2O_3$, $Lu_2O_3$, $La_2O_3$, and SrO.

19. The device of claim 18, wherein:
the charged particles comprise dipoles;
the charged region comprises:
- an interfacial layer comprising positive charges; and
- a metal oxide layer adjacent the interfacial layer, the metal oxide layer comprising negative charges;

the dipoles comprise the positive charges separated from the negative charges by a predetermined distance;
the charge carriers comprise holes;
the interfacial layer comprises a material selected from the group consisting of $SiO_2$ and $GeO_2$; and
the metal oxide layer comprises a positive charge layer material selected from the group consisting of $Al_2O_3$ and $TiO_2$.

20. The device of claim 19, wherein the charged particles are attracted by a dopant in the charged region.

* * * * *